(12) United States Patent
Lin

(10) Patent No.: US 6,487,077 B1
(45) Date of Patent: Nov. 26, 2002

(54) HEAT DISSIPATING DEVICE ADAPTED TO BE APPLIED TO A FLIP CHIP DEVICE

(75) Inventor: Jackie Lin, Shi-Chih (TW)

(73) Assignee: Advanced Thermal Technologies, Hsien (TW)

( * ) Notice: Subject to any disclaimer, the term of this patent is extended or adjusted under 35 U.S.C. 154(b) by 0 days.

(21) Appl. No.: 10/016,414

(22) Filed: Dec. 10, 2001

(51) Int. Cl.$^7$ ................................................. H05K 7/20
(52) U.S. Cl. ........................................................ 361/697
(58) Field of Search ........................ 165/80.2, 80.3, 165/185, 121, 122; 174/16.3; 257/706–707, 712–713, 722, 718–719, 726–727; 361/688, 690, 694–695, 697, 704, 707, 709–710, 714–718, 722

(56) References Cited

U.S. PATENT DOCUMENTS

| | | | | |
|---|---|---|---|---|
| 4,970,579 A | * | 11/1990 | Arldt et al. | ................ 257/713 |
| 5,371,404 A | * | 12/1994 | Juskey et al. | ................ 257/722 |
| 6,008,991 A | * | 12/1999 | Hawthorne et al. | ......... 361/707 |
| 6,093,961 A | * | 7/2000 | Mccullough | ................ 257/718 |

* cited by examiner

Primary Examiner—Gregory Thompson
(74) Attorney, Agent, or Firm—Harness, Dickey & Pierce, P.L.C.

(57) ABSTRACT

In a heat dissipating device, a heat-conductive base plate is mounted on a flip chip base, and is formed with a through hole that extends from an upper surface to a lower surface opposite to the lower surface and disposed in contact with the flip chip base. A heat-conductive block is formed integrally on the upper surface of the base plate, covers the through hole in the base plate, and has a bottom surface flush with the upper surface of the base plate. The bottom surface is formed with a recess that is registered with the through hole in the base plate such that when the base plate is used to cover the flip chip base, the through hole in the base plate allows the chip device to extend into the recess. Multiple heat-dissipating members are formed integrally on the upper surface of the base plate.

5 Claims, 3 Drawing Sheets

HEAT DISSIPATING DEVICE ADAPTED TO BE APPLIED TO A FLIP CHIP DEVICE

BACKGROUND OF THE INVENTION

1. Field of the Invention

The invention relates to a heat dissipating device, more particularly to a heat dissipating device adapted to be applied to a flip chip device.

2. Description of the Related Art

In view of the advantages of short connecting wires, low inductance, controlled high-frequency noise and reduced package size, a flip chip package technique has been widely applied to many kinds of integrated circuit chips.

FIG. 1 illustrates a flip chip package product that includes a flip chip base 10, a chip device 11 and a cover body 12. The flip chip base 10 has a bottom surface provided with a plurality of pins 103, and a top surface opposite to the bottom surface and formed with a plurality of contacts 101 that are coupled electrically to the pins 103. The chip device 11 has a lower surface formed with a plurality of solder balls 111. By using a flip chip bonder (not shown), the chip device 11 is mounted on the top surface of the flip chip base 10, and the solder balls ill of the chip device 11 are disposed in electrical contact with the contacts 101 of the flip chip base 10, respectively. A heat-conductive thermoset material (not shown) is filled between the flip chip base 10 and the chip device 11 so as to reinforce the structural connection therebetween. The cover body 12 has amounting surface formed with a recess 121. When the cover body 12 is mounted on the top surface of the flip chip base 10 after coating an adhesive material on the mounting surface of the cover body 12, the chip device 11 is received in the recess 121 of the cover body 12. A heat-conductive material is filled in the recess 121 between the chip device 11 and the cover body 12. The mounting surface of the cover body 12 are provided with four conductive posts 122, each of which extends into a respective one of a plurality of grounding holes 102 formed in the flip chip base 10, and is grounded when the cover body 12 is mounted on the flip chip base 10 so as to provide electromagnetic interference shielding to the chip device 11. It is noted that the cover body 12 is mainly used to protect the chip device 11, and the cover body 12 has a limited heat-dissipating area, thereby resulting in inferior heat-dissipating efficiency.

SUMMARY OF THE INVENTION

Therefore, the object of the present invention is to provide a heat dissipating device that is adapted to be applied to a flip chip device and that has a relatively large heat-dissipating area.

According to the present invention, a heat dissipating device is adapted to cover a flip chip base that is mounted with a chip device thereon, and comprises:

- a heat-conductive base plate adapted to be mounted on the flip chip base, the base plate having a lower surface adapted to be disposed in contact with the flip chip base, and an upper surface opposite to the lower surface, the base plate being formed with a through hole that extends from the upper surface to the lower surface;
- a heat-conductive block formed integrally on the upper surface of the base plate and covering the through hole in the base plate, the block having a bottom surface flush with the upper surface of the base plate, and a top surface opposite to the bottom surface, the bottom surface having an area larger than that of the through hole, and being formed with a recess that is registered with the through hole in the base plate such that when the base plate is used to cover the flip chip base, the through hole in the base plate allows the chip device to extend into the recess; and
- a plurality of heat-dissipating members formed integrally on the upper surface of the base plate.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
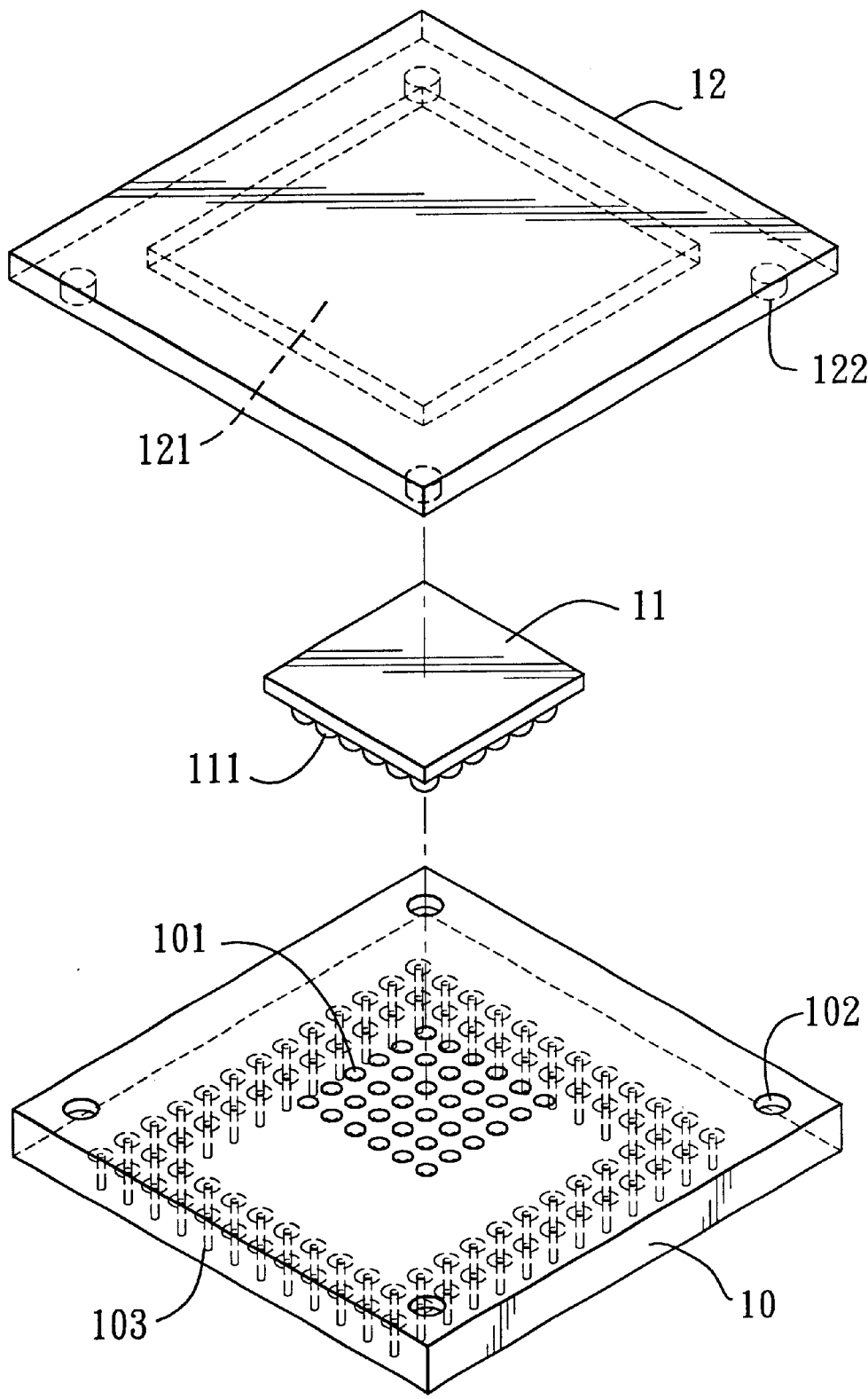
FIG. 1 is an exploded perspective view showing a conventional heat dissipating device applied to a flip chip device.

Before the present invention is described in greater detail, it should be noted that like elements are denoted by the same reference numerals throughout the disclosure.

Figure 2:
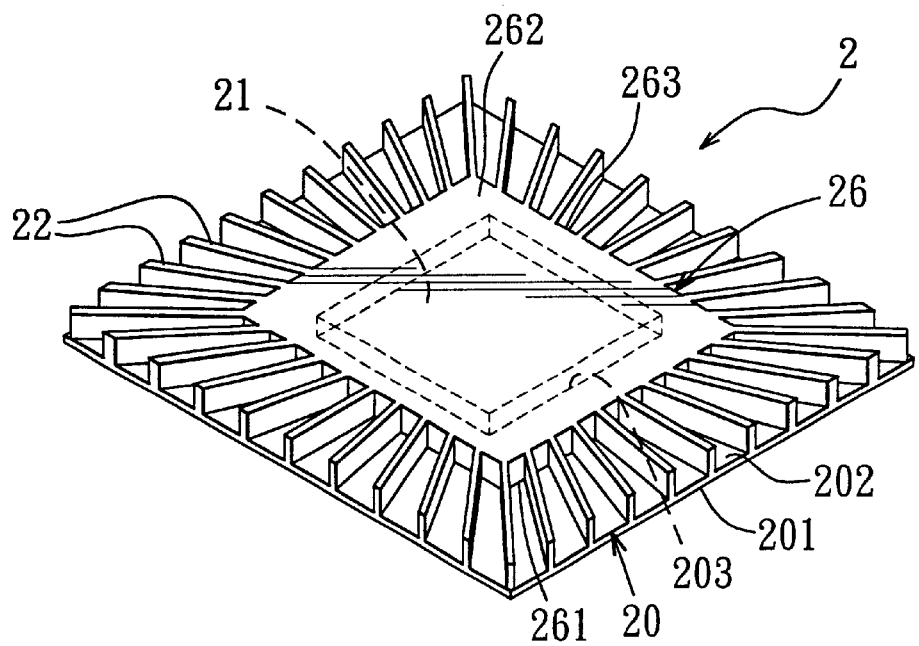
FIG. 2 is a perspective view showing the first preferred embodiment of a heat dissipating device accord this invention.

Referring to FIG. 2, the first preferred embodiment of a heat dissipating device 2 according to the present invention is shown to be used to as a substitute for the aforesaid conventional cover body 12 in FIG. 1, and is adapted to cover the flip chip base 10 that is mounted with the chip device 11 thereon. The heat dissipating device includes a heat-conductive base plate 20, a heat-conductive block 26, and a plurality of heat-dissipating members.

The base plate 20 is adapted to be mounted on the flip chip base 10 (see FIG. 1), and has a lower surface 201 adapted to be disposed in contact with the flip chip base 10, and an upper surface 202 opposite to the lower surface 201. The base plate 20 is formed with a through hole 203 that extends from the upper surface 202 to the lower surface 201.

The block 26 is formed integrally on the upper surface 202 of the base plate 20 and covers the through hole 203 in the base plate 20. The block 26 has a bottom surface 261 flush with the upper surface 202 of the base plate 20, and a top surface 262 opposite to the bottom surface 261. The bottom surface 261 has an area larger than that of the through hole 203 in the base plate 20, and is formed with a recess 21 that is registered with the through hole 203 in the base plate 20 such that when the base plate 20 is used to cover the chip device 11 (see FIG. 1), the through hole 203 in the base plate 20 allows the chip device 11 to extend into the recess 21.

The heat-dissipating members are formed integrally on the upper surface 202 of the base plate 20. In this embodiment, the block 26 has a periphery 263, and the heat-dissipating members include heat-dissipating fins 22 that extend radially from the periphery 263 of the block 26.

Figure 3:
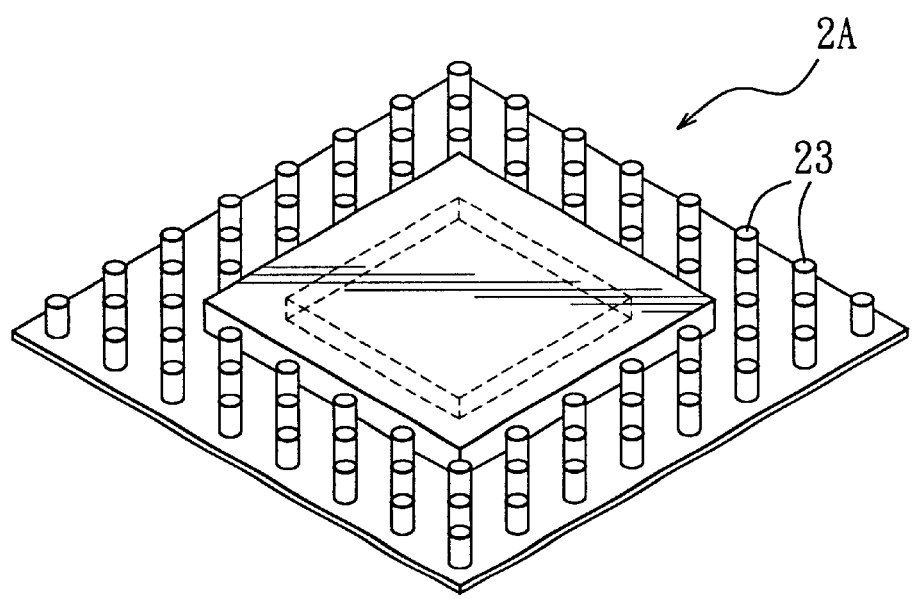
FIG. 3 is a perspective view showing the second preferred embodiment of a heat dissipating device according to this invention.

FIG. 3 illustrates the second preferred embodiment of a heat dissipating device 2A according to this invention, which is a modification of the first preferred embodiment. Unlike the previous embodiment, the heat-dissipating members include upwardly extending heat-dissipating posts 23.

Figure 4:
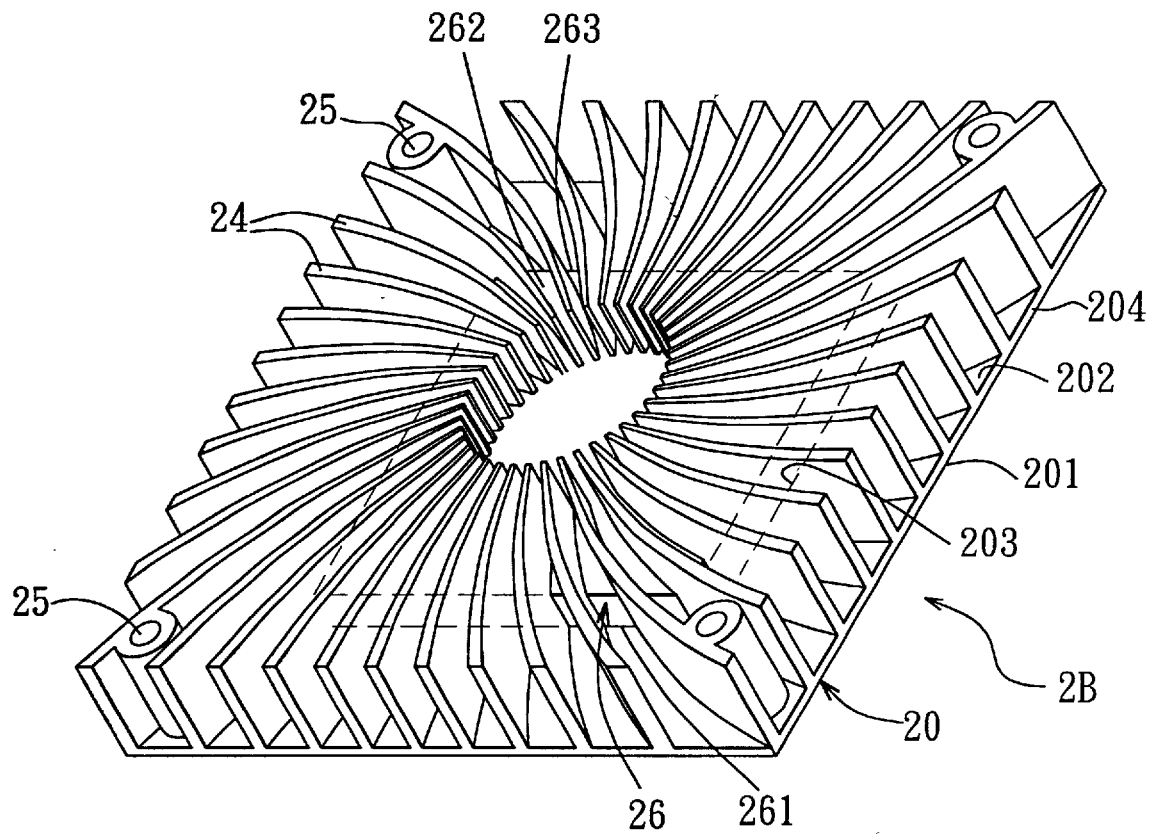
FIG. 4 is a schematic top view showing the third preferred embodiment of a heat dissipating device according to this invention.

FIG. 4 illustrates the third preferred embodiment of a heat dissipating device 2B according to this invention, which is a modification of the first preferred embodiment. Unlike the first preferred embodiment, the base plate 20 has a periphery 204. The heat-dissipating members include curved heat-dissipating fins 24 that extend from the top surface 262 of the block 26 to the periphery 204 of the base plate 20. Four of the heat dissipating fins 24 are formed with a respective threaded hole 25 that is disposed at a respective corner of the base plate 20.

Figure 5:
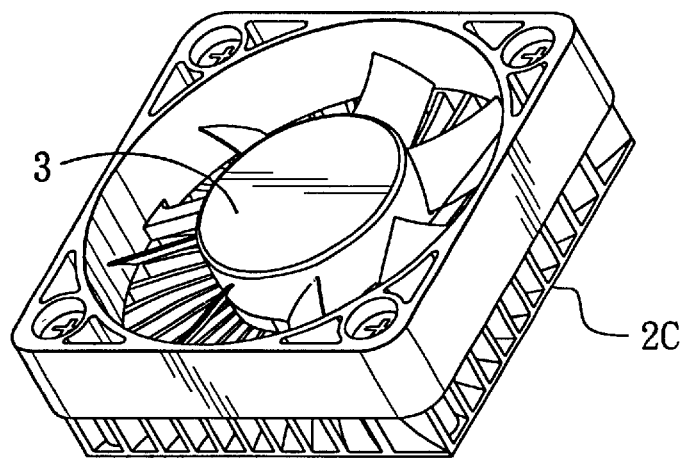
FIG. 5 is a perspective view showing the fourth preferred embodiment of a heat dissipating device according to this invention.

FIG. 5 illustrates the fourth preferred embodiment of a heat dissipating device 2C according to this invention, which is a modification of the third preferred embodiment. Unlike the third preferred embodiment, the heat dissipating device 2C further includes a fan unit 3 mounted on the base plate 20 via fasteners that are threaded into the holes 25 (see FIG. 4), and disposed above the block 26 for enhancing the heat-dissipating efficiency.

Due to the presence of the heat-dissipating members, the heat dissipating device 2, 2A, 2B, 2C of this invention has a larger heat-dissipating area as compared to the aforesaid conventional cover body, thereby enhancing the heat-dissipating efficiency. The object of the invention is thus met.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A heat-dissipating device adapted to cover a flip chip base that is mounted with a chip device thereon, said heat dissipating device comprising:

a heat-conductive base plate adapted to be mounted on the flip chip base, said base plate having a lower surface adapted to be disposed in contact with the flip chip base, and an upper surface opposite to said lower surface, said base plate being formed with a through hole that extends from said upper surface to said lower surface;

a heat-conductive block formed integrally on said upper surface of said base plate and covering said through hole in said base plate, said block having a bottom surface flush with said upper surface of said base base plate, and a top surface opposite to said bottom surface, said bottom surface having an area larger than that of said through hole, and being formed with a recess that is registered with said through hole in said base plate such that when said base plate is used to cover the flip chip base, said through hole in said base plate allows the chip device to extend into said recess; and a plurality of heat-dissipating members formed integrally on said upper surface of said base plate.

2. The heat dissipating device as claimed in claim 1, wherein said block has a periphery, said heat-dissipating members including heat-dissipating fins that extend radially from said periphery of said block.

3. The heat dissipating device as claimed in claim 1, wherein said heat-dissipating members include upwardly extending heat-dissipating posts.

4. The heat dissipating device as claimed in claim 1, wherein said base plate has a periphery, said heat-dissipating members including curved heat-dissipating fins that extend from said top surface of said block to said periphery of said base plate.

5. The heat dissipating device as claimed in claim 1, further comprising a fan unit mounted on said base plate and disposed above said block.

* * * * *